United States Patent [19]

Natsui

[11] Patent Number: 4,800,418

[45] Date of Patent: Jan. 24, 1989

[54] INTEGRATED CIRCUIT WITH IMPROVED MONITORING FUNCTION BY USE OF BUILT-IN ELEMENTS

[75] Inventor: Yoshinobu Natsui, Tokyo, Japan

[73] Assignee: NEC Corporation, Tokyo, Japan

[21] Appl. No.: 773,060

[22] Filed: Sep. 6, 1985

[30] Foreign Application Priority Data

Sep. 6, 1984 [JP] Japan .................. 59-186803

[51] Int. Cl.⁴ .......................................... H01L 23/48
[52] U.S. Cl. ......................................... 357/68; 357/13
[58] Field of Search ............................. 357/68, 13

[56] References Cited

U.S. PATENT DOCUMENTS 4,694,315  9/1987  Svedberg .............................. 357/13

Primary Examiner—Robert S. Macon
Attorney, Agent, or Firm—Burns, Doane, Swecker & Mathis

[57] ABSTRACT

A semiconductor integrated circuit of the type having at least one reference element fabricated on a semiconductor chip on which functional elements are formed is obtained by a high integration structure. The reference element is coupled through a switching element to a bonding pad to which a part of the functional elements is connected. The switching element assumes a non-conductive state when the functional elements operate and a conductive state when a voltage applied thereto is outside the normal operating voltage of the functional elements.

18 Claims, 3 Drawing Sheets

INTEGRATED CIRCUIT WITH IMPROVED MONITORING FUNCTION BY USE OF BUILT-IN ELEMENTS

BACKGROUND OF THE INVENTION

The present invention relates to a semiconductor integrated circuit having a function of monitoring circuit elements formed therein by use of built-in monitoring elements.

Recent improvement in semiconductor integrated circuits has been remarkable and the integrating scale of integrated circuits has become large due to reduction in size of elements fabricated in integrated circuits and by fine lithographic technology. Accompanied by such integration density, however, deviation in manufacturing parameters such as concentration of impurities has become comparatively large and it has been required to reduce such deviation. Moreover, in order to reduce manufacturing cost, large-sized wafers such as 5 inch wafers are widely employed in place of 3 inch wafers. However, it is difficult to uniformly fabricate each chip included in the same wafer in case of such large-sized wafers. For example, impurity concentration of a center portion of a wafer is different from that of a peripheral portion of the wafer, and hence deviation in functional parameters is inevitably present among chips formed on the same wafer.

Under such circumstance, it has been practiced that reference elements, or monitoring elements are built-in each chip which are fabricated through the same sequence of manufacturing processes as that for fabrication of the circuit elements (functional elements) of the integrated circuit. The characteristics or parameters of the functional elements are determined by checking the reference elements. For example, in order to check parameters of transistors fabricated in each chip, a reference transistor is additionally fabricated in each chip through the same process. Since there is similarity in parameters between the reference transistor and the functional transistors, parameters of the functional transistors can be predicted from the parameters of the reference transistor. Heretofore, such reference elements are fabricated with independent conductive pads solely connected thereto. In order to contact testing probes with the conductive pads, the conductive pads are required to have a sufficient area which facilitates contact between the testing probes and the conductive pads. Accordingly, the area occupied by the conductive pads for the reference elements shares a large portion in each chip. Thus, according to the prior art, there has been limitation in promoting the integration scale of integrated circuits.

In order to avoid the above problem, it may be conceivable that the size of the conductive pads are reduced. However, in such case, it is difficult to contact testing probes with the conductive pads of reduced-size, and automated testing of the reference elements becomes impractical.

SUMMARY OF THE INVENTION

It is an object of the present invention to provide a semiconductor integrated circuit with improved arrangement of the reference element.

It is another object of the present invention to provide a semiconductor integrated circuit of the type having a function of monitoring circuit elements thereof by use of built-in reference elements in a highly integrated structure.

The semiconductor integrated circuit according to the present invention is of the type having at least one reference element fabricated simultaneously with functional elements on the same semiconductor chip, and featured in that the reference element is connected through a switching element to the same bonding pad to which a part of the functional elements is electrically connected and the switching element assumes a conductive state only when a voltage outside the normal operating voltages of the functional elements is applied to the bonding pad to which the switching element is connected.

According to the present invention, the same bonding pads are shared by the functional elements and the reference element according to the range of voltage applied thereto. Therefore, any independent conductive pads only for the reference elements are no more necessary.

Therefore, the integrated circuit can be fabricated in highly integrated structures.

DETAILED DESCRIPTION OF THE INVENTION

Figure 1:
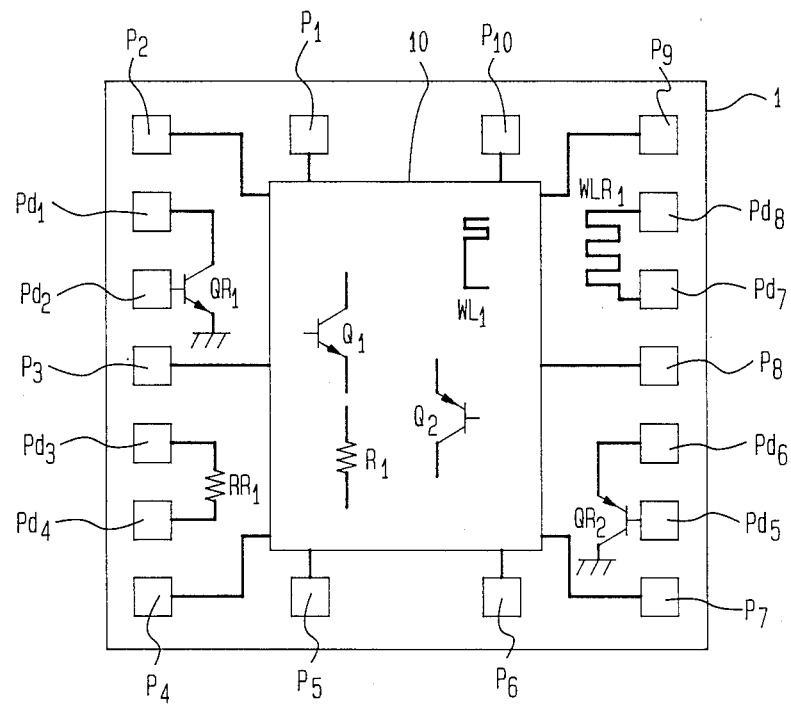
FIG. 1 is a block diagram showing an example of integrated circuits according to a prior art.

Referring to FIG. 1, a prior art integrated circuit of the type having reference elements is explained.

A functional circuit 10 is formed on a center portion of a semiconductor chip 1. Bonding pads $P_1$ to $P_{10}$ are formed on the periphery of the chip 1 and electrically connected to the functional circuit 10. The functional circuit 10 includes NPN transistors such as $Q_1$, PNP transistors such as $Q_2$, resistors such as $R_1$ and aluminum wirings such as $WL_1$ as functional elements. On the periphery of the chip 1 outside the boundary of the functional circuit 10, there are formed a reference NPN transistor $QR_1$ which is fabricated simultaneously with the NPN transistors in the functional circuit 10, a reference PNP transistor $QR_2$ which is fabricated simultaneously with the PNP transistors in the functional circuit 10, a reference resistor $RR_1$ which is fabricated simultaneously with the resistors in the functional circuit 10, and a reference wiring $WLR_1$ fabricated at the same time as $WL_1$. Conductive pads $Pd_1$ to $Pd_8$ are connected to these reference elements as illustrative. For example, the conductive pads $Pd_1$ and $Pd_2$ are connected to a collector and a base of the reference NPN transistor $QR_1$, respectively. In this arrangement, the conductive pads $Pd_1$ to $Pd_8$ have substantially the same size as the bonding pads $P_1$ to $Pd_{10}$. Thus, parameters of the elements in the functional circuit 10 are predicted by measuring parameters of the reference elements. Such measuring of the reference elements is conducted by contacting testing probes to the conductive pads $Pd_1$ to $Pd_2$. For example, parameters of NPN transistors $Q_1$ are predicted by measuring electrical parameters of the reference NPN transistor $QR_1$ through the conductive pads.

However, according to this circuit, the conductive pads $Pd_1$ to $Pd_8$ occupy a large area of the semiconductor chip 1 and hence, the reduction in the chip size has been prevented.

Figure 2:
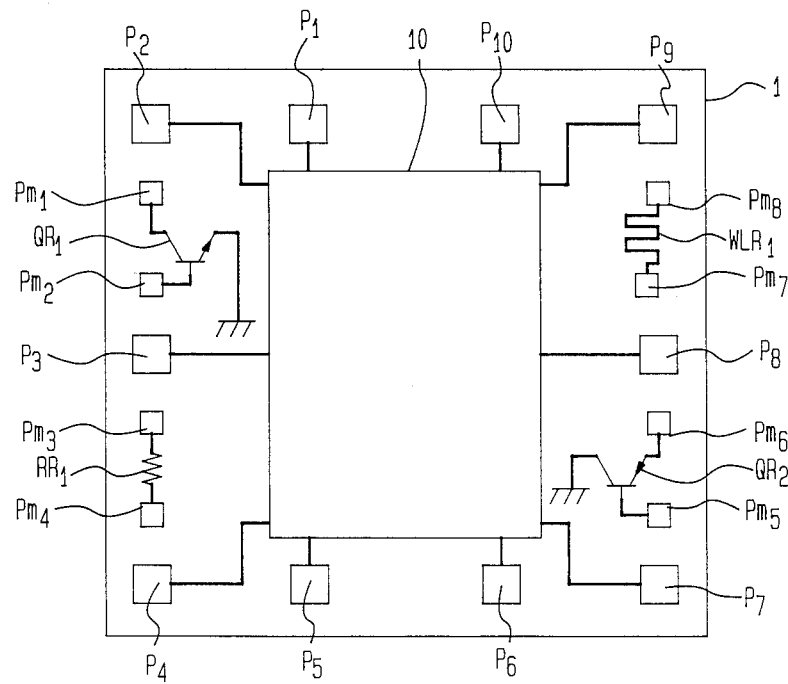
FIG. 2 is a block diagram showing another example of integrated circuits according to a prior art.

FIG. 2 shows another prior art integrated circuit. In this figure, portions or elements corresponding to those in FIG. 1 are designated by the same references. In this circuit, in place of the conductive pads $Pd_1$ to $Pd_8$ of FIG. 1, mini-pads Pm 1 to Pm 8 are employed. As is clear from FIG. 2, the size of the mini-pads Pm 1 to Pm 8 is small as compared with the boding pads $P_1$ to $P_{10}$ and the conductive pads $Pd_1$ to $Pd_8$.

Accordingly, the area occupied by the mini-pads Pm 1 to Pm 8 on the chip 1 is remarkably reduced as compared to the circuit of FIG. 1. However, since the size of each mini-pad is small, it is difficult to contact a testing probe with the mini-pad. Thus, efficiency in manufacturing, especially in testing, is deteriorated.

Figure 3:
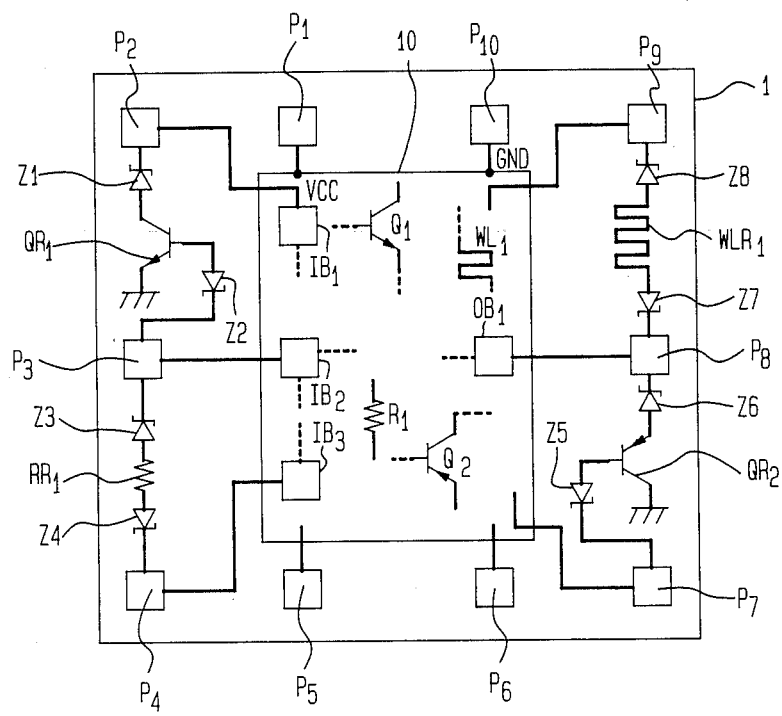
FIG. 3 is a block diagram showing an integrated circuit according to the present invention.

Referring to FIG. 3, a semiconductor inregrated circuit according to an embodiment of the invention is explained. In this figure, the same or similar portions and elements as those in FIG. 1 are indicated by the same reference characters.

A functional circuit 10 is connected to bonding pads $P_1$ to $P_{10}$ to which external leads (not shown) are electrically connected. The functional circuit 10 includes input circuits $IB_1$, $IB_2$ and $IB_3$ and an output circuit $OB_1$. An NPN transistor $Q_1$, a PNP transistor $Q_2$, a resistor $R_1$ and a wiring $WL_1$ may be located within the input or output circuits $IB_1$, $IB_2$, $IB_3$, $OB_1$ or outside them. The pads $P_2$, $P_3$ and $P_4$ are connected to inputs of the input circuits $IB_1$, $IB_2$ and $IB_3$, respectively. The pad $P_8$ is connected to an output of the output circuit $OB_1$. The pads $P_1$ and $P_{10}$ are connected to the functional circuit 10 to supply a power voltage $V_{CC}$ and a ground potential GND. Other pads $P_5$, $P_6$, $P_7$ and $P_9$ are connected to the functional circuit 10 in a conventional manner. A reference NPN transistor $QR_1$, a reference resistor $RR_1$, a reference PNP transistor $QR_2$, and a reference wiring $WLR_1$ are provided along the periphery of the chip 1. These reference elements are fabricated at the same time with elements forming the functional circuit 10. According to the invention, these reference elements are connected to the bonding pads $P_1$, $P_2$, $P_3$, $P_4$, $P_7$, $P_8$ and $P_9$ through zener diodes $Z_1$ to $Z_8$ as voltage switching elements. Namely, a collector and a base of the reference NPN transistor $QR_1$ is coupled to the pad $P_2$ via the zener diode $Z_1$ and to the pad $P_3$ via the zener diod $Z_2$, respectively. The zener diodes $Z_1$ and $Z_2$ are connected in the reverse direction from the pads $P_2$ and $P_3$ towards the transistor $QR_1$. The both ends of the reference resistor $RR_1$ is connected to the pads $P_3$ and $P_4$ through the zener diodes $Z_3$ and $Z_4$, respectively. The emitter and base of the reference PNP transistor $QR_2$ are connected to the pads $P_8$ and $P_7$ via the zener diodes, respectively. Similarly, the ends of the reference wiring $WLR_1$ are connected to the pads $P_9$ and $P_8$ via the zener diodes $Z_8$ and $Z_7$, respectively. All the zener diodes $Z_1$ to $Z_8$ are inserted between the pads and the reference elements in the reverse direction viewing from the respective pads. Each of the zener diodes $Z_1$ to $Z_8$ assumes conductive state when a high voltage such as 10 volts or more is impressed across itself in the direction reverse to its PN junction while assumes non-conductive when the voltage across the diode is less than the above high voltage in the reverse direction. The value of the power voltage $V_{CC}$ for the functional circuit 10 is less than 7 volts and the voltage range of the signal applied to or output from the pads is within the range of $-0.5$ to $5.5$ volts in the normal function mode of the circuit 10.

Accordingly, in the normal function mode, each of the zener diodes $Z_1$ to $Z_8$ are non-conducting so that all the reference elements are electrically isolated from the pads because voltages applied to the pads are less than the above high voltage and the reference elements do not affect the operation of the function circuit 10.

Figure 4:
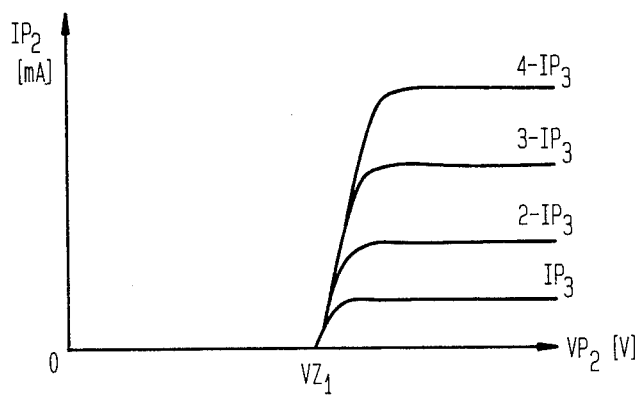
FIG. 4 is a diagram explaining operations of the integrated circuit of FIG. 3.

With the reference to FIG. 4, an explanation of the operation is given with respect to the reference NPN transistor $QR_1$ by way of example.

FIG. 4 shows relationship between a collector current $IP_2$ of the reference transistor $QR_1$ and a voltage $VP_2$ applied at the pad $P_2$ with a base current $IP_3$ applied from the pad $P_3$ to the reference transistor $QR_1$ being employed as parameter. When the voltage $VP_2$ is smaller than the zener voltage $VZ_1$ of the zener diode $Z_1$, the diode $Z_1$ is non-conducting. When the voltage applied to the pad $P_3$ is lower than the zener voltage of the diode $Z_2$, the diode $Z_2$ assumes non-conducting state thereby to isolate the reference transistor $QR_1$ from the pad $P_2$ and from the input circuit $IB_1$. When the voltage $VP_2$ takes a value of the zener voltage $VZ_1$ or more, the diode $Z_1$ is turned to the conducting state so that the collector of the transistor $QR_1$ is electrically connected to the pad $P_2$. Under this condition of $VP_2$, when the voltage applied to the pad $P_3$ exceeds the zener voltage of the diode $Z_2$, a base current $IP_3$ is applied to the base of the transistor $QR_1$ and the collector current $IP_2$ is caused in accordance with the amount of the base currents $IP_3$, $2IP_3$ ... $4IP_3$ as illustrated. Thus, the characteristics of the reference transistor $QR_1$ can be detected through the pads $P_2$ and $P_3$. Similarly, the characteristics of the reference PNP transistor $QR_2$ can be measured by applying voltages higher than the zener voltages of the diodes $Z_6$ and $Z_5$ to the pads $P_7$ and $P_8$, respectively.

In case where the reference resistor $RR_1$ is measured, a high voltage more than the sum of the zener voltage $VZ_3$ of the zener voltage $Z_3$ and a forward voltage $VF_4$ of the diode $Z_4$ should be applied between the pads $P_3$ and $P_4$ to render the two diodes $Z_3$ and $Z_4$ conductive. The value of the voltages $(V_{Z3} + V_{F4})$ is almost the same as $V_{Z3}$ because the $V_{F4}$ is less than 1 volt. Also, the reference wiring $WLR_1$ is measured in the same way.

Figure 5:
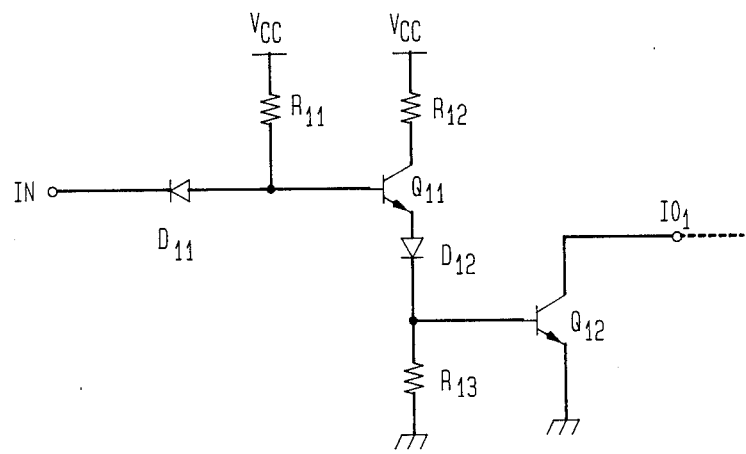
FIG. 5 is a circuit diagram of an input circuit employed in the circuit of FIG. 3.

FIG. 5 shows an example of the input circuit $IB_1$, $IB_2$ and $IB_3$. This example is composed of an input stage of a diode $D_{11}$, a pull-up resistor $R_{11}$, an inverting transistor $Q_{11}$, a collector resistor $R_{12}$, an emitter resistor $R_{13}$ and a diode $D_{12}$, and an output stage of a transistor $Q_{12}$ having a collector $IO_1$ from which an output is derived. This circuit is basically a so-called DTL circuit. An input terminal IN is connected to the pad $P_2$, $P_3$ or $P_4$. Between the input IN and the ground GND, the diode $D_{11}$, a base-emitter junction of $Q_{11}$ and the diode $D_{12}$ are present in series. Therefore, even when the voltage above the zener voltage such as 10 to 15 volts is applied to the pad $P_2$, $P_3$ or $P_4$, no current path occurs between the input IN and the ground GND. Therefore, this type of input circuit is suitable for the invention because the input circuit does not affect the measuring of the reference element.

Figure 6:
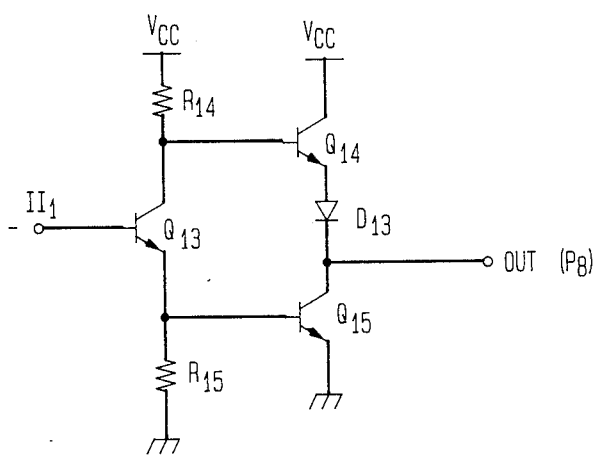
FIG. 6 is a circuit diagram of an output circuit employed in the circuit of FIG. 3.

FIG. 6 shows an example of the output circuit $OB_1$. The circuit is composed of a transistor $Q_{13}$ receiving an internal signal $2I_1$ and a push-pull connection of transistors $Q_{14}$ and $Q_{15}$. The pad $P_8$ is connected to a collector of the transistor $Q_{15}$. A diode $D_{13}$ is formed of a base-collector junction of a vertical transistor and therefore a high breakdown voltage. Also, the collector - base junction of the transistor $Q_{15}$ has a high breakdown voltage. Accordingly, even when the high voltage above the zener voltage is applied to the pad $P_8$, no breakdown occurs in the output circuit $OB_1$ and the output circuit $OB_1$ does not affect the reference element.

Figure 7:
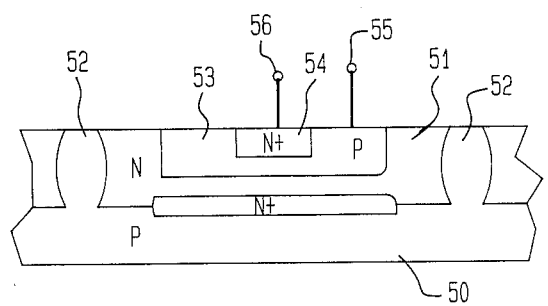
FIG. 7 is a sectional diagram of the zener diode employed in the invention.

FIG. 7 shows an example of the zener diodes $Z_1$ to $Z_8$. Each of the zener diodes employs a vertical transistor structure composed of a P type substrate 50, an N type collector 51, a P type base 53, an N type emitter 54 and a P type isolation region 5 L. The substrate 50 and the N type epitaxial layer 51 are common with those of the reference elements and the functional elements in the circuit 10. The base - emitter junction of this transistor is employed as the zener diode in which an emitter electrode 56 and a base electrode 55 are used as an anode and a cathode of the zener diode. In this case, the zener voltage of about 7 to 9 volts is obtained.

In the above-mentioned testing mode, it is favorable that the pad $P_1$ for $V_{CC}$ supply is kept open or at ground potential in order to avoid unnecessary current flow in the functional circuit.

As has been described above, the present invention provides the improved semiconductor integrated circuit having reference elements. It is apparent that the present invention is not limited by the above embodiment, but applicable to any type of integrated circuits.

I claim:

1. A semiconductor integrated circuit comprising: a semiconductor chip, a functional circuit formed on said semiconductor chip, said functional circuit including at least one functional element, a plurality of bonding pads formed on said semiconductor chip and electrically connected to said functional circuit, at least one reference element formed on said semiconductor chip, the type of said reference element being analogous to that of said functional element, and switching means coupled between said reference element and one of said bonding pads, said functional circuit operating by a given range of voltages, said switching means assuming a conducting state only when a voltage outside said given range of voltages is applied to said one bonding pad.

2. The integrated circuit according to claim 1, in which said switching means includes a zener diode.

3. The integrated circuit according to claim 1, in which said functional element and said reference element are transistors.

4. The integrated circuit according to claim 1, in which said functional circuit includes a DTL circuit having an input coupled to said one of said bonding pads.

5. The integrated circuit according to claim 1, in which said reference element is formed on the area near said one of said bonding pads.

6. A semiconductor integrated circuit comprising: a semiconductor chip, a functional circuit formed on said semiconductor chip, said functional circuit including a plurality of elements and operating by a given range of voltages, a plurality of bonding pads formed on said chip, said functional circuit being electrically connected to said bonding pads, a plurality of reference elements formed on said semiconductor chip, and a plurality of switching means each coupled between each one of said reference elements and one of said bonding pads, said switching means assuming a non-conductive state when a voltage applied to the associated one of said bonding pads is within said given range of voltages and assuming a conductive state when a voltage applied to said associated one of said bonding pads is outside said given range of voltages.

7. The integrated circuit according to claim 6, in which each of said switching means includes a diode.

8. The integrated circuit according to claim 6, in which said functional circuit includes a DTL circuit having an input coupled to one of said bonding pads to which one of said reference elements is coupled through one of said switching means.

9. The integrated circuit according to claim 7, in which said diode is formed of a base-emitter junction of a bipolar transistor.

10. The integrated circuit according to claim 6, in which said elements in said functional circuit and said reference elements include transistors and resistors.

11. A semiconductor integrated circuit comprising: a semiconductor chip, a plurality of functional elements formed on said semiconductor chip, a plurality of bonding pads formed on said semiconductor chip, means for connecting a part of said functional elements to said bonding pads, said functional elements being operated by a given range of voltages applied to said pads, a plurality of reference elements formed on said semiconductor chip, and a plurality of switching means each coupled between one of said reference elements and one of said bonding pads, each of said switching means assuming a non-conductive state when a voltage within said given range is applied to the associated bonding pad and a conductive state when a voltage outside said given range is applied to said associated bonding pad.

12. The integrated circuit according to claim 11, in which each of said switching means includes a diode.

13. A semiconductor integrated circuit comprising: a semiconductor chip,
a functional circuit formed on said semiconductor chip, said functional circuit including at least one functional element,
a plurality of bonding pads formed on said semiconductor chip and electrically connected to said functional circuit,
at least one reference element formed on said semiconductor chip, the type of said reference element being analogous to that of said functional element and having a correlative parameter to said functional element, and
switching means coupled between said reference element and one of said bonding pads, said functional circuit operating by a given range of voltages, said switching means assuming a conducting state only when a voltage outside said given range of voltages is applied to said one bonding pad, whereby a parameter of said functional element is predicted by measuring the parameter of said reference element by applying the voltage outside said given range of voltages to said one bonding pad.

14. The integrated circuit according to claim 13, in which said switching means includes a zener diode.

15. The integrated circuit according to claim 14, in which said functional element and said reference element are transistors.

16. The integrated circuit according to claim 14, in which said functional circuit includes a DTL circuit having an input coupled to said one of said bonding pads.

17. A semiconductor integrated circuit comprising:
a semiconductor chip,
a plurality of functional bipolar transistors formed on said semiconductor chip,
a plurality of bonding pads formed on said semiconductor chip,
means for connecting a part of said functional bipolar transistors to said bonding pads, said functional bipolar transistors being operated by a given range of voltages applied to said bonding pads,
a reference bipolar transistor formed on said semiconductor chip,
a first switching means coupled between a collector-emitter path of said reference transistor and one of said bonding pads, and
a second switching means coupled between a base of said reference transistor and another of said bonding pads, each of said switching means assuming a non-conductive state when a voltage within said given range is applied to the associated bonding pad and a conductive state when a voltage outside said given range is applied to said associated bonding pad.

18. The integrated circuit according to claim 17, in which each of said switching means includes a diode.

* * * * *